United States Patent
George (10) Patent No.: US 8,574,398 B2
(45) Date of Patent: Nov. 5, 2013

(54) APPARATUS AND METHOD FOR DETAPING AN ADHESIVE LAYER FROM THE SURFACE OF ULTRA THIN WAFERS

(75) Inventor: Gregory George, Colchester, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 260 days.

(21) Appl. No.: 13/115,232

(22) Filed: May 25, 2011

(65) Prior Publication Data

US 2011/0290415 A1  Dec. 1, 2011

Related U.S. Application Data

(60) Provisional application No. 61/348,794, filed on May 27, 2010.

(51) Int. Cl.
*B32B 38/10* (2006.01)
(52) U.S. Cl.
USPC ........... 156/714; 156/715; 156/759; 156/764; 156/931; 156/941
(58) Field of Classification Search
USPC ......... 156/247, 707, 714, 715, 758, 759, 764, 156/930, 931, 941, 942
See application file for complete search history.

(56) References Cited

U.S. PATENT DOCUMENTS

| | | | |
|---|---|---|---|
| 5,492,590 A * | 2/1996 | Sakai | 156/701 |
| 6,802,926 B2 * | 10/2004 | Mizutani et al. | 156/247 |
| 7,335,605 B2 | 2/2008 | Yamamoto | |
| 7,846,288 B2 | 12/2010 | Larson et al. | |
| 7,857,029 B2 | 12/2010 | Yamamoto | |
| 2003/0060021 A1 | 3/2003 | Kurosawa et al. | |
| 2003/0064592 A1 | 4/2003 | Yamamoto | |
| 2003/0131929 A1 | 7/2003 | Yamamoto | |
| 2005/0126694 A1 | 6/2005 | Yamamoto | |
| 2005/0148156 A1 | 7/2005 | Yamamoto | |
| 2006/0089004 A1 | 4/2006 | Yamamoto | |
| 2007/0074822 A1 | 4/2007 | Akechi | |
| 2007/0169895 A1 * | 7/2007 | Kobayashi et al. | 156/584 |
| 2007/0197002 A1 | 8/2007 | Kurosawa et al. | |
| 2007/0261783 A1 | 11/2007 | Larson et al. | |
| 2007/0284038 A1 | 12/2007 | Yamamoto et al. | |
| 2008/0023133 A1 * | 1/2008 | Yamamoto | 156/285 |
| 2008/0308221 A1 | 12/2008 | Michael et al. | |
| 2010/0059183 A1 | 3/2010 | Lin et al. | |

FOREIGN PATENT DOCUMENTS

| | | | |
|---|---|---|---|
| JP | 2000-331961 A | 11/2000 | |
| JP | 2007-158037 A | 6/2007 | |

* cited by examiner

*Primary Examiner* — Mark A Osele
(74) *Attorney, Agent, or Firm* — AKC Patents LLC; Aliki K. Collins (57) ABSTRACT

An apparatus for removing an adhesive layer from a wafer surface includes a chuck, a contact roller, a pick-up roller and a detaping tape. The chuck supports and holds a wafer that has an adhesive layer on its top surface. The contact roller rotates around a first axis and moves linearly along a direction perpendicular to the first axis over the chuck and the supported wafer. The pick-up roller rotates around a second axis, that is parallel to the first axis. The detaping tape rolls around the contact roller and the pick-up roller, and as it rolls it attaches to the adhesive layer, and then is removed together with the adhesive layer. The contact roller has a surface that has a footprint of a circle when rolled along a flat surface.

16 Claims, 11 Drawing Sheets

APPARATUS AND METHOD FOR DETAPING AN ADHESIVE LAYER FROM THE SURFACE OF ULTRA THIN WAFERS

CROSS REFERENCE TO RELATED CO-PENDING APPLICATIONS

This application claims the benefit of U.S. provisional application Ser. No. 61/348,974 filed May 27, 2010 and entitled "APPARATUS AND METHOD FOR DETAPING AN ADHESIVE LAYER FROM THE SURFACE OF ULTRA THIN WAFERS", the contents of which are expressly incorporated herein by reference.

FIELD OF THE INVENTION

The present invention relates to an apparatus and a method for detaping an adhesive layer from the surface of ultra thin wafers, and more particularly to industrial-scale detaping equipment having a specially designed roller used for detaping the adhesive layer.

BACKGROUND OF THE INVENTION

Several semiconductor wafer processes include wafer thinning steps. In some applications the wafers are thinned down to a thickness of less than 100 micrometers for the fabrication of integrated circuit (IC) devices. Thin wafers have the advantages of improved heat removal and better electrical operation of the fabricated IC devices. In one example, GaAs wafers are thinned down to 25 micrometers to fabricate power CMOS devices with improved heat removal. Wafer thinning also contributes to a reduction of the device capacitance and to an increase of its impedance, both of which result in an overall size reduction of the fabricated device. In other applications, wafer thinning is used for 3D-Integration bonding and for fabricating through wafer vias.

Wafer thinning is usually performed via back-grinding and/or chemical mechanical polishing (CMP). CMP involves bringing the wafer surface into contact with a hard and flat rotating horizontal platter in the presence of liquid slurry. The slurry usually contains abrasive powders, such as diamond or silicon carbide, along with chemical etchants such as ammonia, fluoride, or combinations thereof. The abrasives cause substrate thinning, while the etchants polish the substrate surface at the submicron level. The wafer is maintained in contact with the abrasives until a certain amount of substrate has been removed in order to achieve a targeted thickness.

For wafer thicknesses of over 200 micrometers, the wafer is usually held in place with a fixture that utilizes a vacuum chuck or some other means of mechanical attachment. However, for wafer thicknesses of less than 200 micrometers and especially for wafers of less than 100 micrometers, it becomes increasingly difficult to mechanically hold the wafers and to maintain control of the planarity and integrity of the wafers during thinning. In these cases, it is actually common for wafers to develop microfractures and to break during CMP.

An alternative to mechanical holding of the wafers during thinning involves attaching a first surface of the device wafer (i.e., wafer processed into a device) onto a carrier wafer and then thinning down the exposed opposite device wafer surface. The bond between the carrier wafer and the device wafer is temporary and is removed upon completion of the thinning and any other processing steps. In some temporary bonding processes, an adhesive layer is used for bonding the carrier wafer to the device wafer. After processing the device wafer, the carrier wafer is debonded and the adhesive layer that remains on the surface of the ultra thin device wafer is removed.

Several methods and equipment have been suggested for removing the adhesive layer from the surface of the ultra thin device wafer. However, in many cases the thinned wafers break during the removing of the adhesive layer. Accordingly, there is a need for controlled removal of the adhesive layer from the surface of ultra thin wafers in order to avoid breakage of the thinned wafers.

SUMMARY OF THE INVENTION

The present invention relates to an apparatus for removing an adhesive layer from the surface of ultra thin wafers. The apparatus includes a specially designed contact roller for attaching a detaping tape onto the adhesive layer and then removing the detaping tape together with the adhesive layer.

In general, in one aspect, the invention features an apparatus for removing an adhesive layer from a wafer surface. The apparatus includes a chuck, a contact roller, a pick-up roller and a detaping tape. The chuck is configured to support and hold a wafer that comprises an adhesive layer on its top surface. The contact roller comprises an elongated cylindrical body extending along a first axis passing through its center and is configured to rotate around the first axis and to move linearly along a direction perpendicular to the first axis over the chuck and the supported wafer. The pick-up roller comprises an elongated cylindrical body extending along a second axis passing through its center and is configured to rotate around the second axis. The second axis is parallel to the first axis and the pick-up roller is arranged at a first distance from the contact roller. The detaping tape is configured to roll around the contact roller and the pick-up roller. The detaping tape is also configured to attach to the adhesive layer and then to be removed together with the adhesive layer. The contact roller comprises a 360° degrees circular surface layer rolled around and attached to its outer cylindrical surface. The contact roller further comprises means for attaching the detaping tape onto the adhesive layer by rotating clock-wise around its axis and linearly moving along a first direction over the wafer and contacting the adhesive layer with the 360° degrees circular surface layer.

Implementations of this aspect of the invention may include one or more of the following features. The contact roller further comprises means for removing the detaping tape with the attached adhesive layer by rotating counter-clockwise around its axis and linearly moving along a second direction, opposite to the first direction, over the wafer. The contact roller further comprises means for applying pressure during the attachment of the detaping tape onto the adhesive layer. The 360° degrees circular surface layer comprises a diameter equal to the diameter of the adhesive layer. The 360° degrees circular surface layer comprises a thickness in the range of 1-2 millimeters. The apparatus further includes means for controlling the pressure applied by the contact roller and means for controlling the linear and rotational motion of the contact roller over the wafer, to ensure good contact and adhesion between the detaping tape and the adhesive layer. The applied pressure is in the range of 1-2 psi. The contact roller comprises semi-compliant materials.

In general, in another aspect, the invention features a method for removing an adhesive layer from a wafer surface. The method includes the following: First, providing a chuck configured to support and hold a wafer that comprises an adhesive layer on its top surface. Next, providing a contact roller comprising an elongated cylindrical body extending along a first axis passing through its center and being configured to rotate around the first axis and to move linearly along a direction perpendicular to the first axis over the chuck and the supported wafer. Next, providing a pick-up roller comprising an elongated cylindrical body extending along a second axis passing through its center and being configured to rotate around the second axis and wherein the second axis is parallel to the first axis and the pick-up roller is arranged at a first distance from the contact roller. Next, providing a detaping tape configured to roll around the contact roller and the pick-up roller. The detaping tape is configured to attach to the adhesive layer and then to be removed together with the adhesive layer. The contact roller comprises a 360° degrees circular surface layer rolled around and attached to its outer cylindrical surface. Finally, attaching the detaping tape onto the adhesive layer by rotating clock-wise around its axis and linearly moving along a first direction over the wafer and contacting the adhesive layer with the 360° degrees circular surface layer. The method further includes removing the detaping tape with the attached adhesive layer by rotating counter-clockwise around its axis and linearly moving along a second direction, opposite to the first direction, over the wafer. The method further includes applying pressure during the attaching of the detaping tape onto the adhesive layer.

BRIEF DESCRIPTION OF THE DRAWINGS

Referring to the figures, wherein like numerals represent like parts throughout the several views.

DETAILED DESCRIPTION OF THE INVENTION

Figure 1:
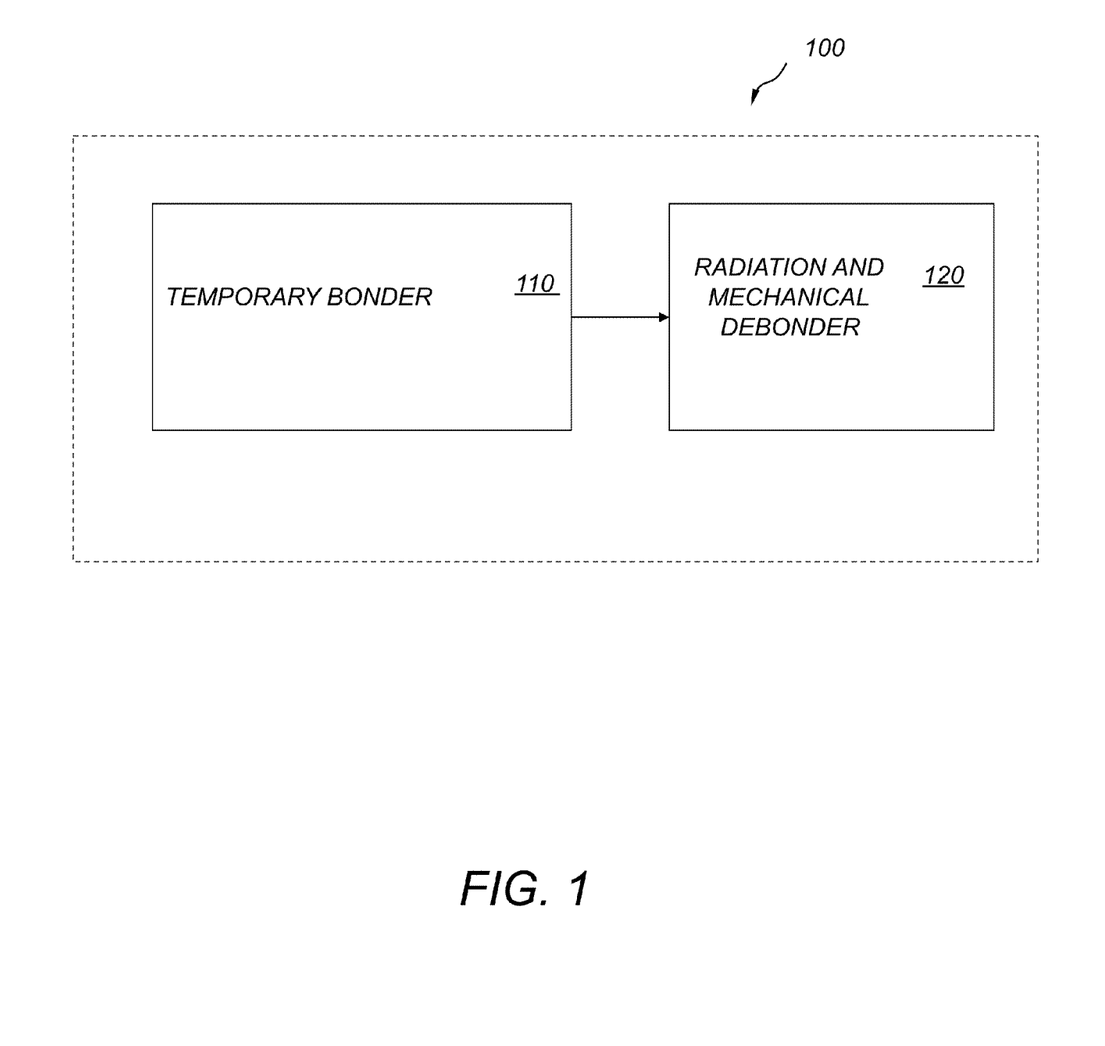
FIG. 1 is an overview schematic diagram of a temporary wafer bonder and debonder system.

Referring to FIG. 1, an improved apparatus for temporary wafer bonding 100 includes a temporary bonder 110 and a debonder 120. Bonder 110 facilitates the temporary bonding process shown in FIG. 2. Debonder 120 facilitates the debonding process shown in FIG. 2.

Figure 2:
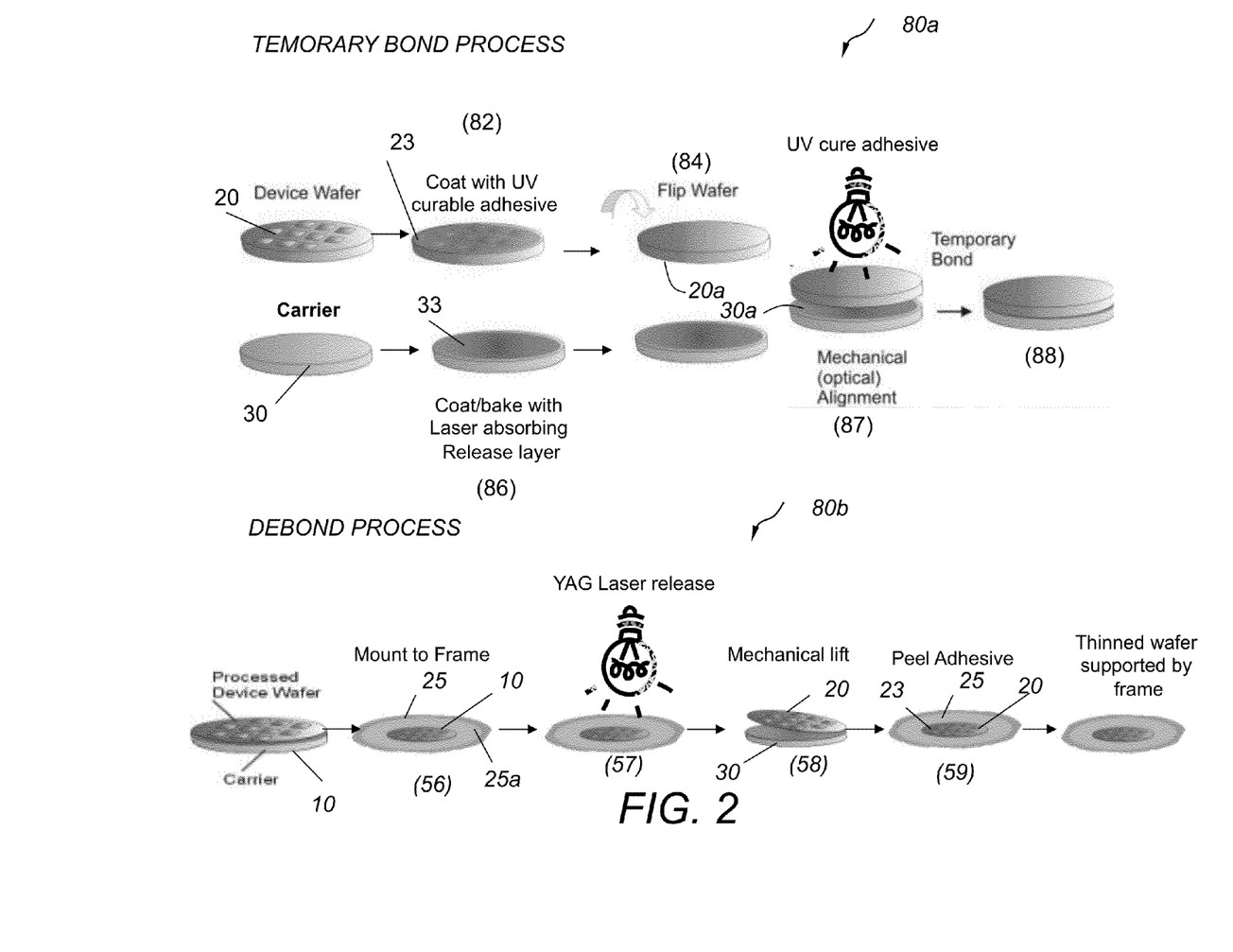
FIG. 2 is a schematic diagram of a temporary wafer bonding process and a debonding process performed in the bonder and debonder of FIG. 1, respectively.

Referring to FIG. 2, temporary bond process 80a includes the following steps. First, a surface of the device wafer 20 is coated with an adhesive layer 23 (82). In one example, adhesive layer 23 is a UV curable adhesive LC3200™, manufactured by 3M Company, MN, USA. The adhesive coated device wafer is then flipped (84). Next, a light-absorbing release layer 33 is spin-coated on a surface 30a of the carrier wafer 30 (86). In one example, light absorbing release layer 33 is a LC4000, manufactured by 3M Company, MN, USA. Next, the flipped device wafer 20 is aligned with the carrier wafer so that the surface 20a of the device wafer with the adhesive layer 23 is opposite to the surface 30a of the carrier wafer 30 with the light absorbing release layer 33. The two surfaces 20a and 30a are brought into contact and the adhesive layer 23 is cured with UV light (87). The two wafers are bonded (88) in temporary bonder 410, shown in FIG. 3. The bond is a temporary bond between the light absorbing release layer 33 and the adhesive layer 23 and is formed under vacuum of 0.1 mbar and low applied bond force.

Figure 3:
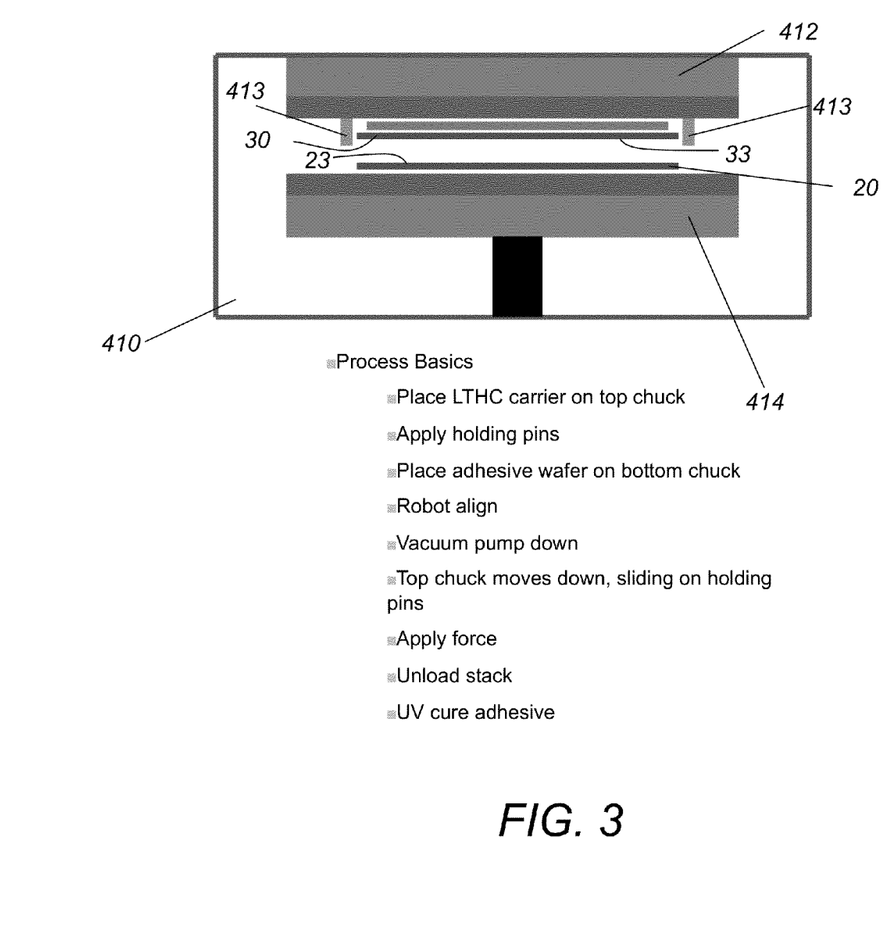
FIG. 3 depicts a schematic cross-sectional view of the bonder of FIG. 1 and a list of the process steps for performing the temporary wafer bonding process of FIG. 2.

Referring to FIG. 3, the carrier wafer 30 with the laser absorbing release layer LTHC layer 33 is placed on the top chuck 412 and held in place by holding pins 413. Next, the device wafer 20 is placed on the bottom chuck 414 with the adhesive layer 23 facing up. Next, the wafers 20, 30 are aligned, the chamber is evacuated, and the top chuck 412 with the carrier wafer 30 is dropped onto the device wafer 20. A low force is applied for the formation of the bond between the release layer 33 and the adhesive layer 23. Next, the bonded wafer stack 10 is unloaded and the adhesive is cured with UV light.

Figure 4:
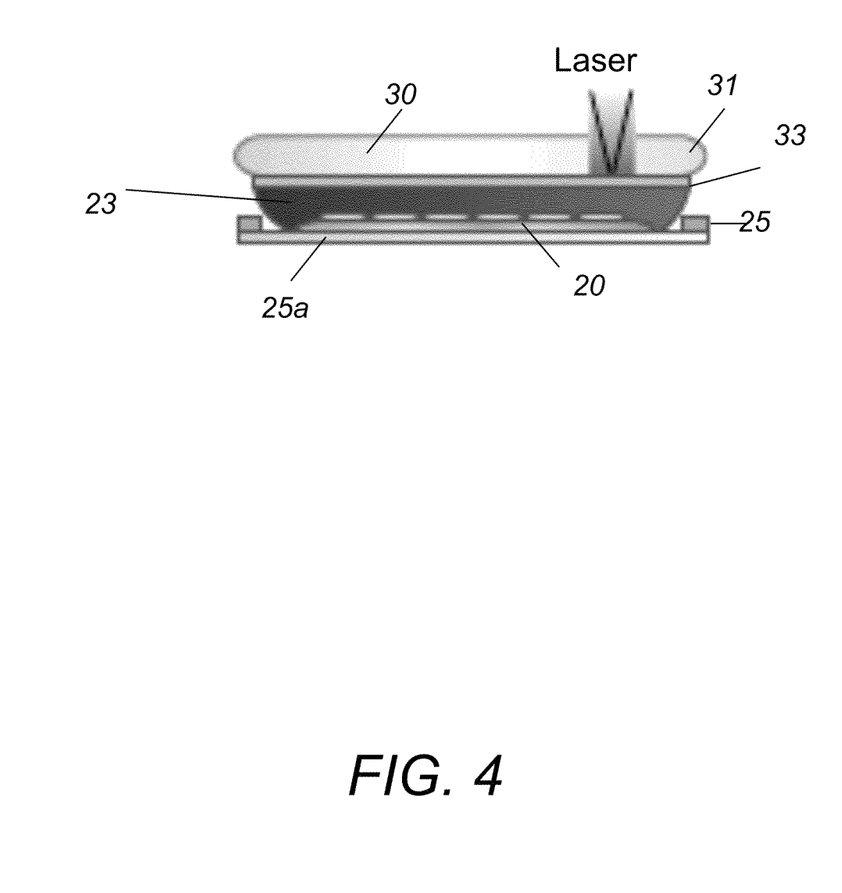
FIG. 4 depicts a schematic cross-sectional side view of the laser debonding step of FIG. 2.
Figure 5:
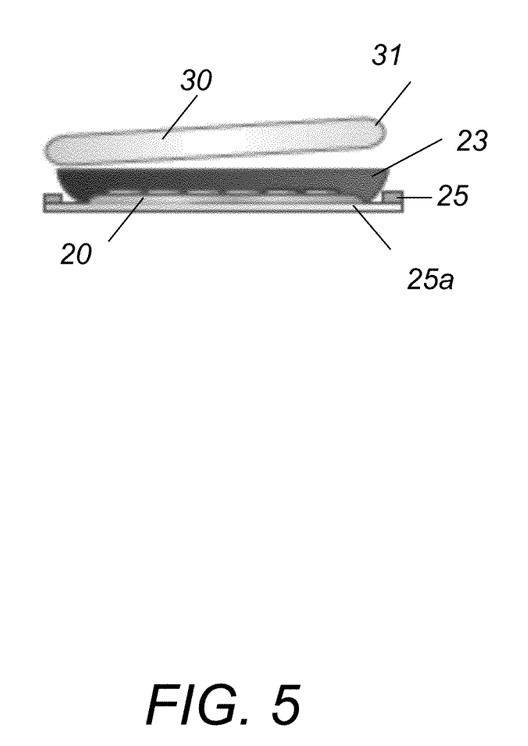
FIG. 5 depicts a schematic cross-sectional side view of the mechanical debonding step of FIG. 2.

Referring back to FIG. 2, the debond process 80b includes the following steps. The bonded wafer stack 10 is mounted onto a dicing frame 25 (56) and the carrier wafer 30 is illuminated with a YAG laser beam, as shown in FIG. 4. The laser beam causes the separation of the wafer stack along the release layer 33 (57) and the separated carrier wafer 30 is mechanically lifted away from the device wafer 20 (58) by pushing edge 31 away, as shown in FIG. 5. The laser debonding process is a low stress process that utilizes no chemicals and is carried out at room temperature. The mechanical debonding process utilizes very low force. After separation the carrier is recycled, cleaned and reused again. The mechanical debonding operation is described in co-pending application Ser. No. 12/761,014 entitled "Apparatus for mechanically debonding temporary bonded semiconductor wafers" the contents of which are incorporated herein by reference. The adhesive layer 23 is then peeled away from the device wafer surface 20a (59) and the thinned device wafer 20 remains supported by the dicing frame 25.

Figure 6:
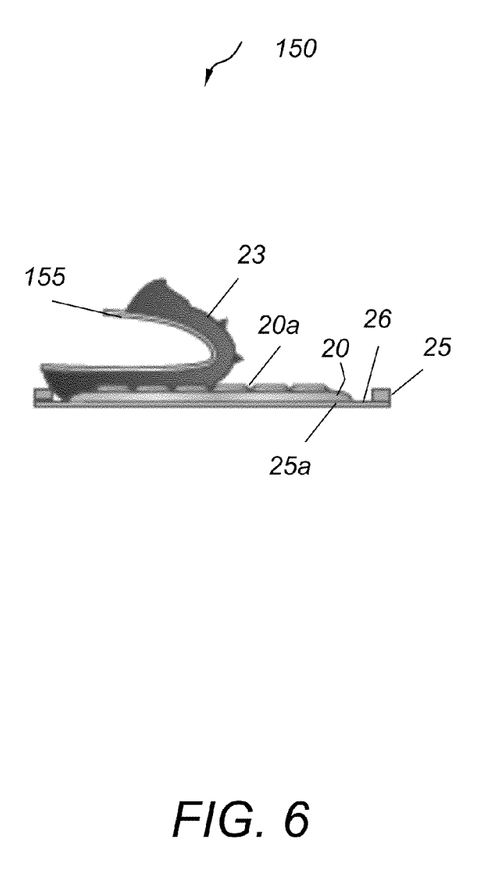
FIG. 6 is a schematic diagram of the detaping process of FIG. 2.

Following the debonding operation the UV curable adhesive layer 23 is removed via a detaping process 150. Referring to FIG. 6, a detaping tape 155 is applied on top of the exposed adhesive layer 23. In one example, detaping tape 155 is tape 3305 manufactured by 3M Company. Tape 3305 is a transparent polyester film tape with an aggressive rubber adhesive specifically designed for the removal of silicon backgrinding tape. The detaping tape 155 is pressed onto and attached to the adhesive layer 23 and when the tape 155 is peeled away the adhesive layer 23 is also peeled away from the surface 20a of the device wafer 20. Chemical cleaning may be used to remove any remaining adhesive residue from the device wafer surface 20a. However, the adhesive residue levels on the device wafer 20 after the removal of the adhesive layer 23 with the detaping process 150 are minimal and usually no post-peel cleaning is required. Removal of the adhesive layer with the detaping process creates very little stress to the thinned wafer and is compatible with low-k dielectrics.

Figure 7:
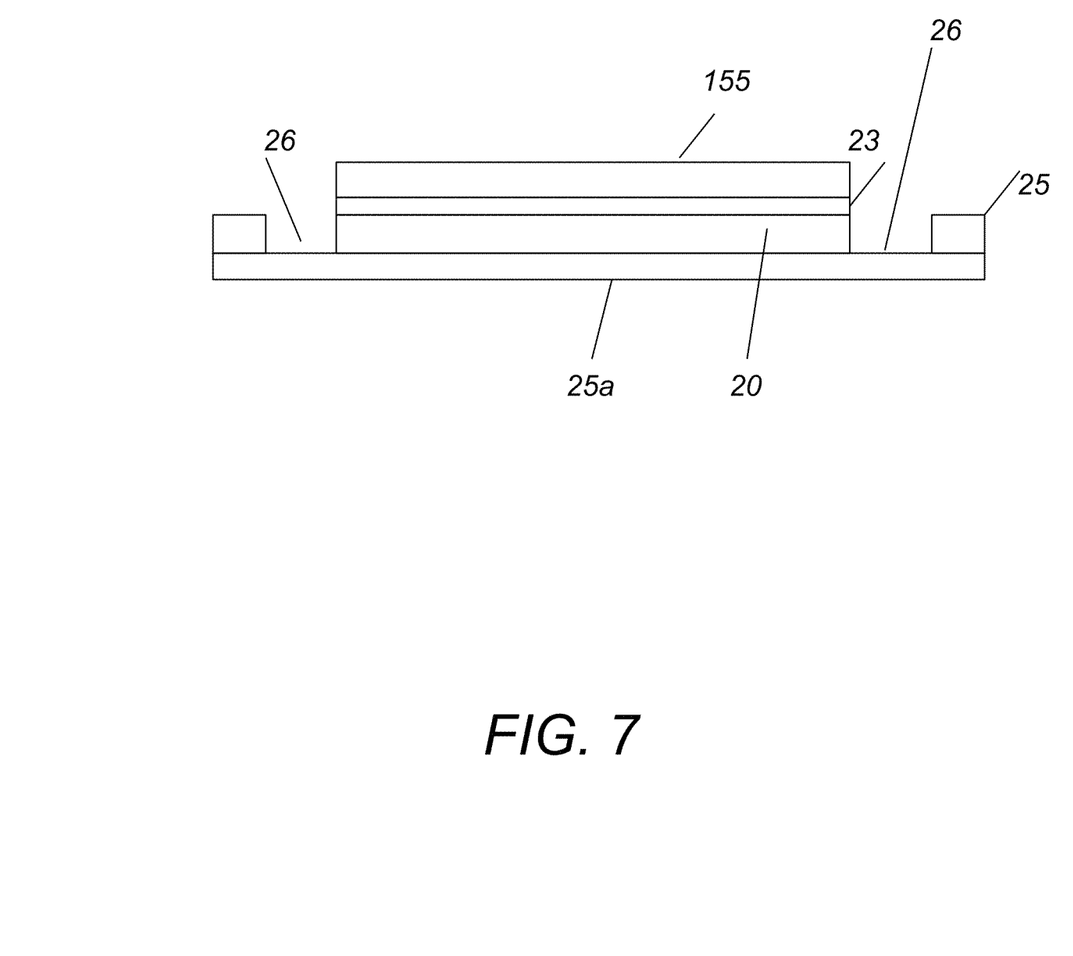
FIG. 7 is a schematic cross-sectional side view of the thinned wafer with the applied detaping tape, according to this invention.

One of the problems with the detaping process involves the interference of the detaping tape 155 with the components surrounding the device wafer 20. In one example, the detaping tape 155 may stick to the frame 25 or to the frame tape 25a in the area 26 between the frame 25 and the device wafer 20. This interference of the detaping tape 155 with the components surrounding the device wafer 20 may cause breakage of the thin device wafer 20 and may prevent the removal of the adhesive layer 23. In order to avoid this interference between the detaping tape 155 and the components surrounding the device wafer 20 provisions need to be taken to ensure that the detaping tape 155 is only applied and attached to the top surface of the adhesive layer 23 and only in the area above the device wafer 20, as shown in FIG. 7

Figure 8:
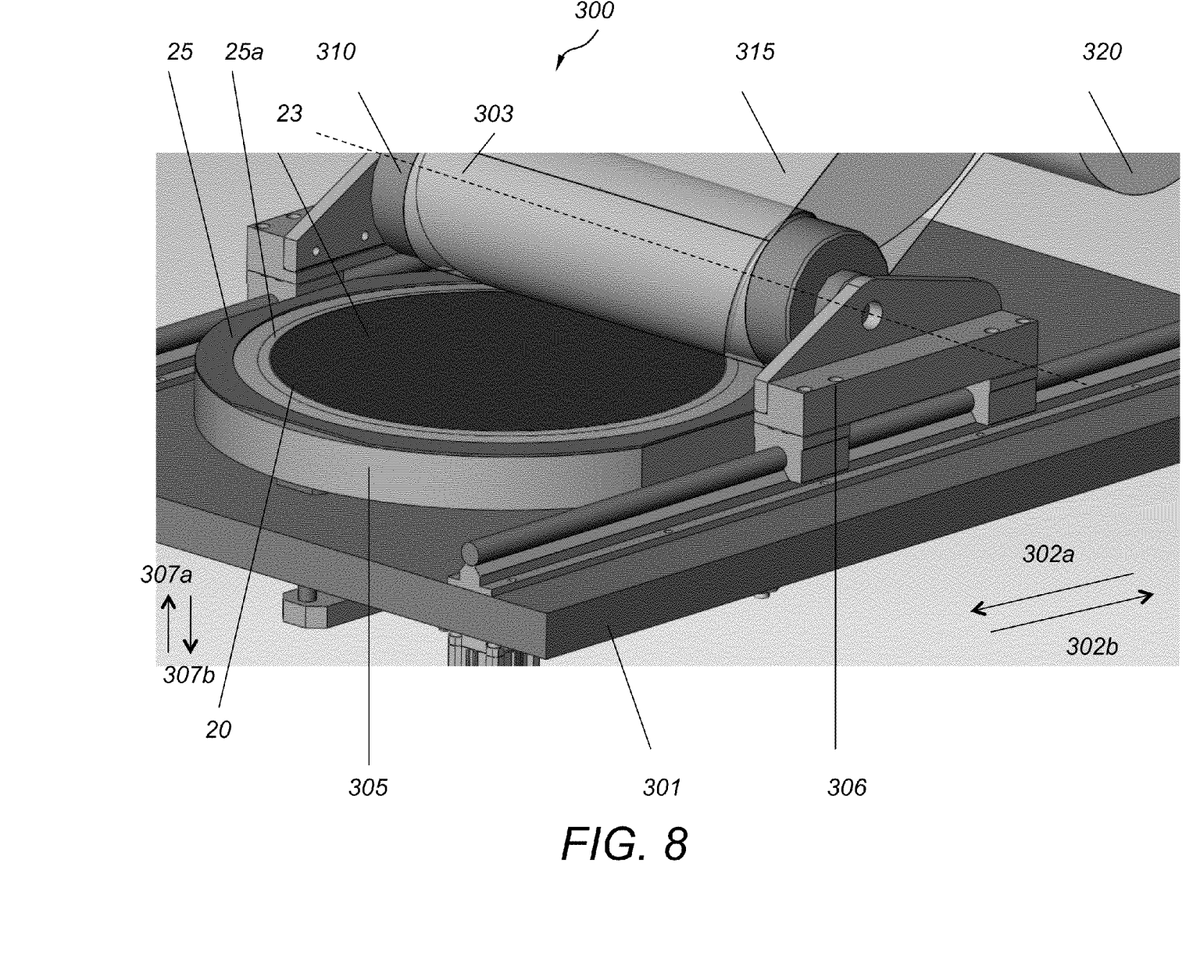
FIG. 8 is a schematic diagram of the detaper equipment according to this invention.
Figure 9:
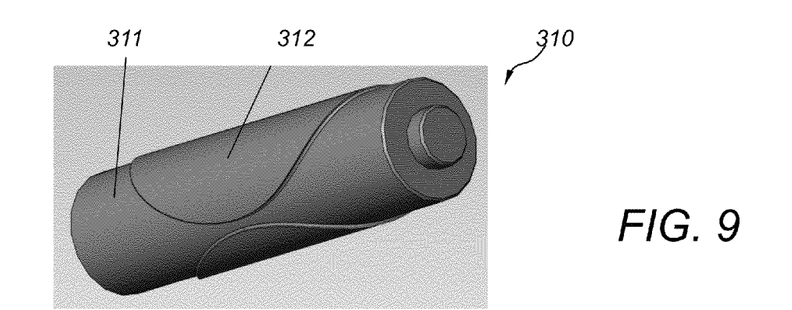
FIG. 9 is a schematic diagram of the detaper roller of the detaper equipment in FIG. 8.
Figure 10:
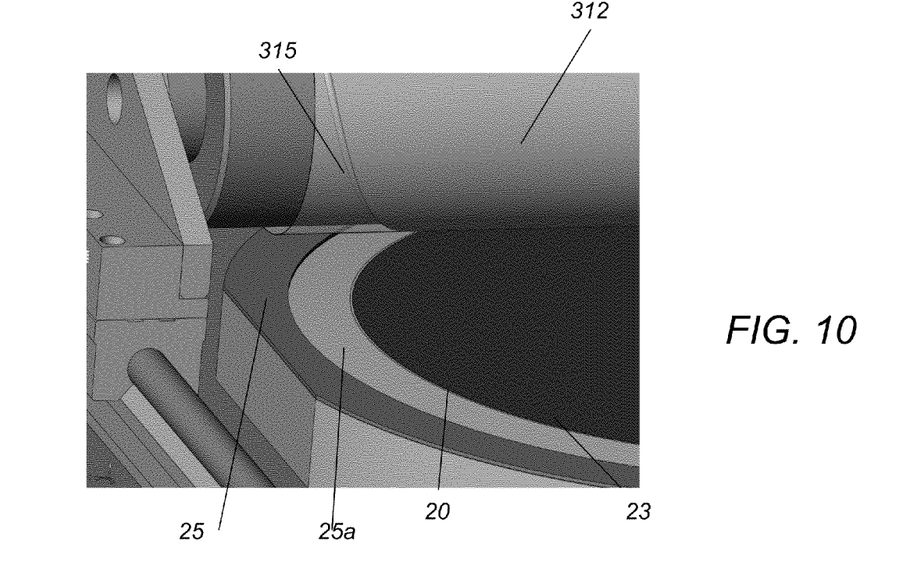
FIG. 10 depicts the beginning of the application of the detaping tape onto the adhesive layer with the equipment of FIG. 8; and FIG. 11
Figure 11:
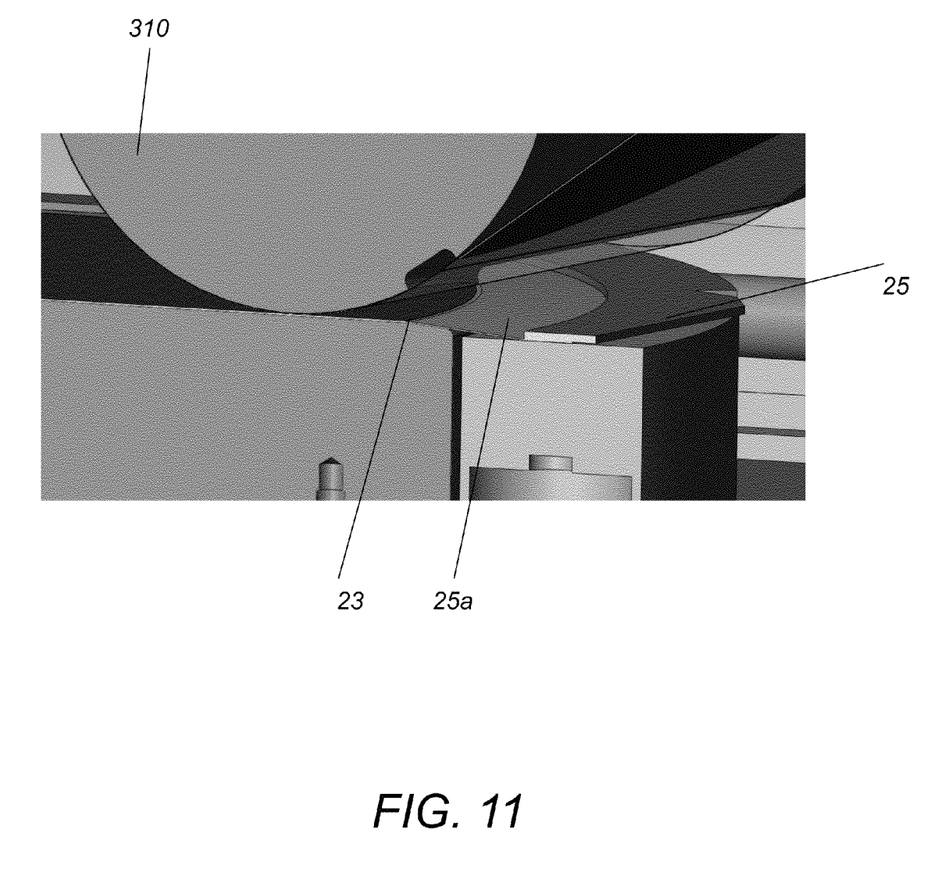

Referring to FIG. 8, detaper 300 includes a support table 301, a vacuum chuck 305, a roller 310 that rolls around axis 303 and moves back and forth above the top surface of table 301 along directions 302a, 302b, a moving stage 306 supporting and moving roller 310 back and for the along direction 302, a pick-up roller 320 and detaping tape 315. The device wafer 20 supported by the frame 25 is placed on top of the vacuum chuck 305 and the vacuum chuck 305 is then moved up in the direction 307a so that the top surface of the device wafer 20 is brought into contact with the roller 310. Next, the detaping tape 315 is applied and pressed on the adhesive layer 23 that is attached to the top surface 20a of the device wafer 20 by rolling the tape 315 around roller 310 and around pick-up roller 320 while moving stage 306 along direction 302a. Roller 310 applies pressure on the top surface 20a of the device wafer 20 and causes high instant adhesion of the taper 315 to the adhesive layer 23. The outer cylindrical surface 311 of roller 310 has a 360° degrees circular surface layer 312 rolled around it, as shown in FIG. 9. Surface layer 312 has a footprint of a circle when rolled along a flat surface. Circular surface layer 312 is dimensioned to ensured contact of the tape 315 only with the adhesive layer 23 on the top surface 20a of the device wafer 20 and no contact with the surrounding components, as shown in FIG. 10 and FIG. 11. Circular surface layer 312 is also dimensioned to ensured application of pressure by the roller 310 only on the area of tape 315 immediately above the top surface 20a of the device wafer 20 and no pressure onto the surrounding components. In one example, circular surface layer 312 has a diameter equal to the diameter of the device wafer 20 (50-300 millimeters) and a thickness of the order of 1-2 millimeters. The pressure applied by the roller 310 and the speed of the translational motion along direction 302a and of the rotational motion around axis 301 are controlled to ensure good contact and adhesion between the tape 315 and the adhesive layer 23. In one example, the pressure applied by the roller is of the order of 1-2 psi and the time it takes for the traversing of the roller 310 is of the order of 15-30 seconds.

Figure 12:
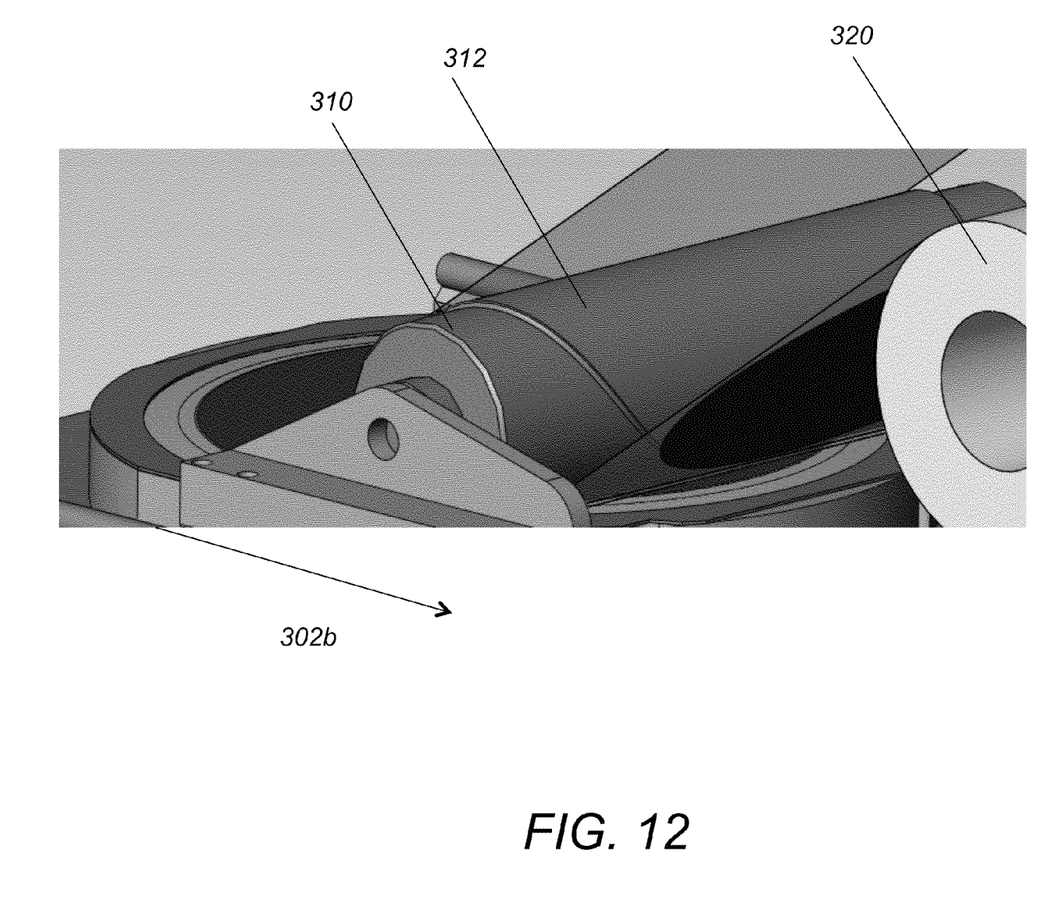
FIG. 12 depicts the peeling away of the detaping tape with the attached adhesive layer with the equipment of FIG. 8.

After the tape 315 is applied and adhered to the adhesive layer 23 on the top surface 20a of the device wafer 20, the direction of the roller stage 306 translation is reversed to 302b and the tape 315 with the attached adhesive layer 23 is peeled away from the top surface 20a of the device wafer 20 and is rolled onto the pick-up roller 320, as shown in FIG. 12. Finally, after the adhesive layer 23 is peeled away from the top surface 20a of the device wafer 20, the vacuum chuck 305 is moved down along 307b and the device wafer supported on the frame 25 is unloaded. Roller 310 is made of semi-compliant metallic or ceramic materials.

Several embodiments of the present invention have been described. Nevertheless, it will be understood that various modifications may be made without departing from the spirit and scope of the invention. Accordingly, other embodiments are within the scope of the following claims.

What is claimed is:

1. An apparatus for removing an adhesive layer from a wafer surface, comprising:
    a chuck configured to support and hold a wafer, wherein said wafer comprises an adhesive layer on its top surface;
    a contact roller comprising an elongated cylindrical body extending along a first axis passing through its center and being configured to rotate around said first axis and to move linearly along a direction perpendicular to said first axis over said chuck and said supported wafer;
    a pick-up roller comprising an elongated cylindrical body extending along a second axis passing through its center and being configured to rotate around said second axis and wherein said second axis is parallel to said first axis and said pick-up roller is arranged at a first distance from the contact roller;
    a detaping tape configured to roll around said contact roller and said pick-up roller, and wherein said detaping tape is configured to attach to said adhesive layer and then to be removed together with the adhesive layer;
    wherein said contact roller comprises a surface layer that has a footprint of a circle when rolled along a flat surface; and
    wherein said contact roller further comprises means for attaching said detaping tape onto said adhesive layer by rotating around said first axis so that it moves linearly along a first direction over said wafer and contacts said adhesive layer with said surface layer.

2. The apparatus of claim 1 wherein said contact roller further comprises means for removing said detaping tape with the attached adhesive layer by rotating around said first axis so that it moves linearly along a second direction, opposite to the first direction, over said wafer.

3. The apparatus of claim 1 wherein said contact roller further comprises means for applying pressure during the attachment of the detaping tape onto the adhesive layer.

4. The apparatus of claim 3, further comprising means for controlling the pressure applied by the contact roller and means for controlling the linear and rotational motion of the contact roller over the wafer, to ensure good contact and adhesion between the detaping tape and the adhesive layer.

5. The apparatus of claim 4, wherein said applied pressure is in the range of 1-2 psi.

6. The apparatus of claim 1, wherein said surface layer comprises a diameter equal to the diameter of the adhesive layer.

7. The apparatus of claim 1, wherein said surface layer comprises a thickness in the range of 1-2 millimeters.

8. The apparatus of claim 1, wherein said contact roller comprises semi-compliant materials.

9. A method for removing an adhesive layer from a wafer surface, comprising:
    providing a chuck configured to support and hold a wafer, wherein said wafer comprises an adhesive layer on its top surface;
    providing a contact roller comprising an elongated cylindrical body extending along a first axis passing through its center and being configured to rotate around said first axis and to move linearly along a direction perpendicular to said first axis over said chuck and said supported wafer;
    providing a pick-up roller comprising an elongated cylindrical body extending along a second axis passing through its center and being configured to rotate around said second axis and wherein said second axis is parallel to said first axis and said pick-up roller is arranged at a first distance from the contact roller;

providing a detaping tape configured to roll around said contact roller and said pick-up roller, and wherein said detaping tape is configured to attach to said adhesive layer and then to be removed together with the adhesive layer;

wherein said contact roller comprises a surface layer that has a footprint of a circle when rolled along a flat surface; and attaching said detaping tape onto said adhesive layer by rotating said contact roller around said first axis and linearly moving said contact roller along a first direction over said wafer and contacting said adhesive layer with said surface layer.

10. The method of claim 9 further comprising removing said detaping tape with the attached adhesive layer by rotating said contact roller around said first axis and linearly moving said contact miler along a second direction, opposite to the first direction, over said wafer.

11. The method of claim 9 further comprising applying pressure during the attaching of the detaping tape onto the adhesive layer.

12. The method of claim 11, further comprising controlling the pressure applied by the contact roller and controlling the linear and rotational motion of the contact roller over the wafer, to ensure good contact and adhesion between the detaping tape and the adhesive layer.

13. The method of claim 12, wherein the applied pressure is in the range of 1-2 psi.

14. The method of claim 9, wherein said surface layer comprises a diameter equal to the diameter of the adhesive layer.

15. The method of claim 9, wherein said surface layer comprises a thickness in the range of 1-2 millimeters.

16. The method of claim 9, wherein said contact roller comprises semi-compliant materials.

* * * * *